(12) United States Patent
Bhimaraj et al.

(10) Patent No.: US 8,163,830 B2
(45) Date of Patent: Apr. 24, 2012

(54) NANOCLAYS IN POLYMER COMPOSITIONS, ARTICLES CONTAINING SAME, PROCESSES OF MAKING SAME, AND SYSTEMS CONTAINING SAME

(75) Inventors: Praveen Bhimaraj, Chandler, AZ (US); Omar Bchir, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 1105 days.

(21) Appl. No.: 11/395,728

(22) Filed: Mar. 31, 2006

(65) Prior Publication Data

US 2007/0232741 A1 Oct. 4, 2007

(51) Int. Cl.
  *C08K 3/34* (2006.01)
(52) U.S. Cl. .................. 524/445; 428/813
(58) Field of Classification Search .......... 428/813; 524/445
  See application file for complete search history.

(56) References Cited

U.S. PATENT DOCUMENTS

| | | | |
|---|---|---|---|
| 5,338,567 A * | 8/1994 | Kohm | 427/97.1 |
| 5,969,083 A * | 10/1999 | Long et al. | 528/194 |
| 6,254,972 B1 * | 7/2001 | Farquhar et al. | 428/209 |
| 6,306,946 B1 * | 10/2001 | Long et al. | 524/451 |
| 6,316,291 B1 * | 11/2001 | Weber | 438/127 |
| 6,924,027 B2 | 8/2005 | Matayabas, Jr. et al. | |
| 7,754,803 B2 * | 7/2010 | Fujiwara et al. | 524/449 |
| 2003/0181560 A1 * | 9/2003 | Kawaguchi et al. | 524/424 |
| 2004/0053061 A1 * | 3/2004 | Yonezawa et al. | 428/458 |
| 2004/0166324 A1 * | 8/2004 | Mishima et al. | 428/413 |
| 2005/0107497 A1 * | 5/2005 | Akaho et al. | 523/457 |
| 2005/0228097 A1 * | 10/2005 | Zhong | 524/430 |
| 2006/0127686 A1 * | 6/2006 | Meloni | 428/473.5 |
| 2007/0013049 A1 | 1/2007 | Asai et al. | |
| 2008/0014336 A1 | 1/2008 | Asai et al. | |
| 2008/0023815 A1 * | 1/2008 | Asai et al. | 257/687 |
| 2008/0200084 A1 * | 8/2008 | Angus et al. | 442/59 |
| 2009/0142567 A1 * | 6/2009 | Kanakarajan et al. | 428/220 |
| 2009/0263640 A1 * | 10/2009 | Ding et al. | 428/220 |
| 2010/0314160 A1 * | 12/2010 | Chang et al. | 174/255 |

FOREIGN PATENT DOCUMENTS

| | | |
|---|---|---|
| CA | 2273542 | 12/1999 |
| CN | 1479768 A | 3/2004 |
| EP | 1473329 A1 | 11/2004 |
| EP | 1633175 A1 | 3/2006 |
| JP | 2003-026939 A | 1/2003 |
| JP | 2006-019451 A | 1/2006 |

(Continued)

OTHER PUBLICATIONS

"PCT Application No. PCT/US2007/007931, International Search Report mailed Jan. 9, 2008", 5 pgs.

(Continued)

*Primary Examiner* — Mark Eashoo
*Assistant Examiner* — Jane L Stanley
(74) *Attorney, Agent, or Firm* — Winkle, PLLC

(57) ABSTRACT

A composition includes a bismaleimide triazine (BT) compound with a nanoclay composited therewith. A mounting substrate includes polymer compound with a nanoclay composited therewith to form a core for the mounting substrate. A process includes melt blending a polymer such as BT with a nanoclay and forming a core. A process includes dissolving a monomer such as BT with a nanoclay and forming a core. A system includes a nanoclay dispersed in a polymer matrix and a microelectronic device mounted on the mounting substrate that includes the nanoclay dispersed in the polymer matrix.

18 Claims, 6 Drawing Sheets

FOREIGN PATENT DOCUMENTS

| | | |
|---|---|---|
| TW | 200302851 A | 8/2003 |
| TW | 200524492 A | 7/2005 |
| WO | WO-03/048251 A1 | 6/2003 |
| WO | WO-2007/123695 A2 | 11/2007 |
| WO | WO-2007123695 A3 | 11/2007 |

OTHER PUBLICATIONS

"PCT Application No. PCT/US2007/007931, Written Opinion mailed Jan. 9, 2008", 8 pgs.

Beyer, G., "Nanocomposites as a New Class of Flame Retardants", *Proceedings of the 51st IWCS (International Wire & Cable Symposium)*, (2002), 584-588.

Lan, T., et al., "Applications of Nanomer® in Nanocomposites: From Concept to Reality", *Nanocomposites 2001*, (Jun. 25-27, 2001, Chicago, IL), (2001), 10 pgs.

Lan, T., et al., "FR Applications of Plastic Nanocomposites", [online]. Nanocor®, 2004. [archived on Mar. 9, 2005]. Retrieved from the Internet: <URL: http://web.archive.org/web/20050309194449/http://www.nanocor.com/tech_papers/FRAppsPlastic.asp>, 3 pgs.

Office Action for Taiwan Patent Application No. 096110624, mailed on Dec. 31, 2010, 28 pages of Taiwan Office Action including 16 pages of English Translation.

Office Action for Chinese Patent Application No. 200780012493.9, mailed on Oct. 19, 2010, 20 pages of Chinese Office Action including 13 pages of English Translation.

Office Action for Korean Patent Application No. 10-2006-7023891, mailed on May 26, 2010, 6 pages of Korean Office Action including 3 pages of English Translation.

Office Action for Chinese Patent Application No. 200780012493.9, mailed on Aug. 17, 2011, 8 pages of Chinese Office Action including 5 pages of English Translation.

Office Action for Japanese Patent Application No. 2008-552517, mailed on Sep. 13, 2011, 6 pages of Chinese Office Action including 3 pages of English Translation.

International Preliminary Report on Patentability received for PCT Patent Application No. PCT/US2007/007931, mailed on Oct. 9, 2008, 9 pages.

* cited by examiner

US 8,163,830 B2

NANOCLAYS IN POLYMER COMPOSITIONS, ARTICLES CONTAINING SAME, PROCESSES OF MAKING SAME, AND SYSTEMS CONTAINING SAME

TECHNICAL FIELD

Embodiments relate generally to board-level structures and integration of devices thereon.

TECHNICAL BACKGROUND

Flame retardants are used in the microelectronic industry for safety reasons. Mounting substrates in addition to motherboards, expansion cards, etc. have used bromide-based or phosphorus-based compounds as flame retardants in the core materials. Mandates from governments to eliminate halides have caused searches elsewhere in the available materials and among new compounds for flame-retardant qualities.

BRIEF DESCRIPTION OF THE DRAWINGS

In order to depict the manner in which the embodiments are obtained, a more particular description of embodiments briefly described above will be rendered by reference to exemplary embodiments that are illustrated in the appended drawings. Understanding that these drawings depict only typical embodiments that are not necessarily drawn to scale and are not therefore to be considered to be limiting of its scope, the embodiments will be described and explained with additional specificity and detail through the use of the accompanying drawings in which.

DETAILED DESCRIPTION

Figure 1:
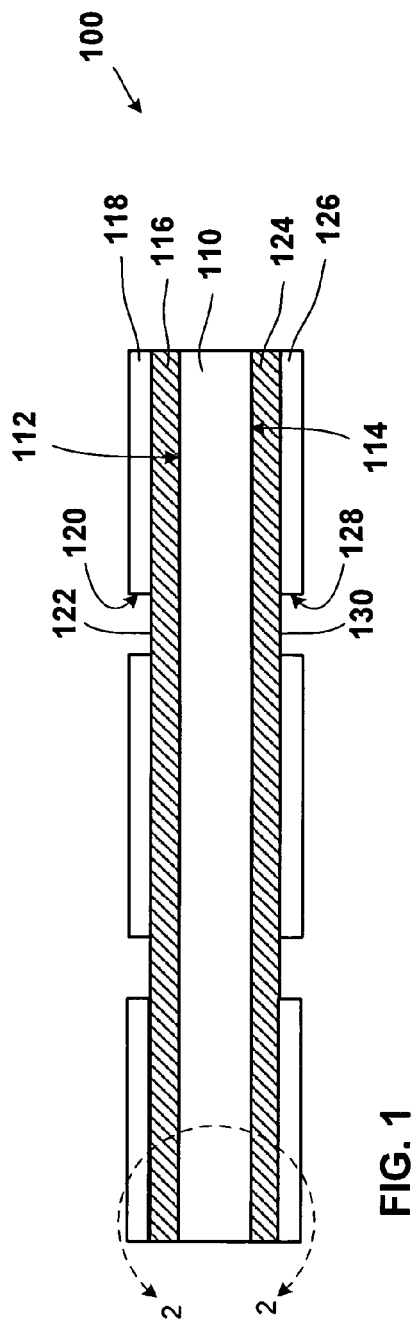
FIG. 1 is a cross-section elevation of a mounting substrate according to an embodiment.

Embodiments relate to a composition that includes a nanoclay particulate dispersed in a polymer matrix. In an embodiment, the polymer matrix includes a bismaleimide triazine (BT) base.

The following description includes terms, such as upper, lower, first, second, etc., that are used for descriptive purposes only and are not to be construed as limiting. The embodiments of an apparatus or article described herein can be manufactured, used, or shipped in a number of positions and orientations. The terms "die" and "chip" generally refer to the physical object that is the basic workpiece that is transformed by various process operations into the desired integrated circuit device. A die is usually singulated from a wafer, and wafers may be made of semiconducting, non-semiconducting, or combinations of semiconducting and non-semiconducting materials. A board is typically a resin-impregnated fiberglass structure that acts as a mounting substrate for the die.

Whenever used in this disclosure, the terms set forth may have the following meanings:

"Clay material," "layered clay," or "layered clay material" means any organic or inorganic material or mixtures thereof, which is in the form of a plurality of adjacent, bound layers. The layered clay includes platelet particles.

"Platelet particles," "platelets," "particles," or "co-planar clustered" mean individual or aggregate unbound layers of the layered clay material. These layers may be in the form of individual platelet particles, ordered or disordered small aggregates of platelet particles, also known as tactoids, and aggregates of tactoids.

"Dispersion" or "dispersed" is a general term that refers to a variety of levels or degrees of separation of the platelet particles. The levels of dispersion include, but are not limited to, "platelet particles," "intercalated," and "exfoliated."

"Intercalated" or "intercalate" means a layered clay material that includes a structure disposed between adjacent platelet particles or tactoids of the aggregate layers, which increases the interlayer spacing between the adjacent platelets and/or the tactoids. In this disclosure, the intercalated structure can be an organic cation and can also be a matrix polymer.

"Exfoliate" or "exfoliated" means platelets dispersed predominantly in an individual state throughout a carrier material, such as a matrix polymer. Typically, "exfoliated" is used to denote the highest degree of separation of platelet particles, with "intercalated" as an intermediate degree of separation of platelets, and "co-planar clustered" as the lowest degree of separation. Because degrees of separation of platelets is substantially a continuum between exfoliated and co-planar clustered, the degree of separation will be assigned a number range for clarity, but the scope of disclosed embodiments may be broader than what is set forth.

"Exfoliation" means a process for forming an exfoliate from an intercalated or otherwise less dispersed state of separation.

"Nanocomposite(s)" or "nanocomposite composition(s)" means a polymer or copolymer having dispersed therein a plurality of nano-sized individual platelets obtained from an exfoliated, layered, nanoclay material.

"Matrix polymer" means a thermoplastic or melt-processable polymer in which the platelet particles are dispersed to form a nanocomposite. In this disclosure, however, the platelet particles may be "co-planar clustered," "intercalated," or "exfoliated" in the matrix polymer to form a nanocomposite.

Reference will now be made to the drawings wherein like structures will be provided with like suffix reference designations. In order to show the structures of various embodiments most clearly, the drawings included herein are diagrammatic representations of integrated circuit structures. Thus, the actual appearance of the fabricated structures, for example in a photomicrograph, may appear different while still incorporating the essential structures of the illustrated embodiments. Moreover, the drawings show the structures necessary to understand the illustrated embodiments. Additional structures known in the art have not been included to maintain the clarity of the drawings.

FIG. 1 is a cross-section elevation of a mounting substrate 100 according to an embodiment. The mounting substrate 100 includes a core 110 with a first side 112 and a second side 114. In an embodiment, the core 110 includes a polymer base that includes a first clay platelet having a particle size of about 99% passing 50 nanometers (nm). In an embodiment, the core 110 is a bismaleimide triazine (BT) polymer base that includes a first clay platelet having a particle size of about 99% passing 50 nm. "First clay platelet" means a first type of clay platelet, unless otherwise noted.

In an embodiment, an article includes the core 110 and a first metallic foil 116 that is disposed upon the core 110 first side 112. In an embodiment, the first metallic foil 116 includes copper and is typical of the copper that can be used in boards to make traces and other electrical structures. A solder mask first film 118 is disposed upon the first metallic foil 116 according to an embodiment.

In an embodiment, the mounting substrate 100 is a board such as a motherboard, an expansion card, a mezzanine board, a dual in-line mounting module board or mounting substrate. During employment of the mounting substrate 100 as a mounting substrate for a microelectronic device, the solder mask first film 118 includes a recess 120, which exposes an upper surface 122 of the first metallic foil 116. In an embodiment, the upper surface 122 of the first metallic foil 116 is a bond pad for a wire bond. In an embodiment, the upper surface 122 of the first metallic foil 116 is a bond pad for an electrical bump.

In an embodiment, the upper surface 122 of the first metallic foil 116 includes a flash layer of metal such as gold. In an embodiment, the upper surface 122 of the first metallic foil 116 includes a flash layer of metal such as titanium. In an embodiment, the upper surface 122 of the first metallic foil 116 includes a flash layer of metal such as a doré alloy of gold and silver.

In an embodiment, the article includes the core 110 and a second metallic foil 124 that is disposed upon the core 110 second side 114. In an embodiment, the second metallic foil 124 includes copper and is typical of the copper that can be used in boards to make traces and other electrical structures. A solder mask second film 126 is disposed upon the second metallic foil 124 according to an embodiment.

In an embodiment, the mounting substrate 100 is a board such as a dual in-line memory module (DIMM) or other mounting substrate that has accessibility to both a first metallic foil 116 and a second metallic foil 124. During employment of the mounting substrate 100 as a board for a microelectronic device, the solder mask second film 126 includes a recess 128, which exposes a lower surface 130 of the second metallic foil 124. In an embodiment, the lower surface 130 of the second metallic foil 124 is a bond pad for a wire bond. In an embodiment, the lower surface 130 of the first metallic foil 124 is a bond pad for an electrical bump. In an embodiment, a flash layer is also disposed upon the lower surface 130, as set forth herein for any embodiment of the upper surface 122.

Figure 2:
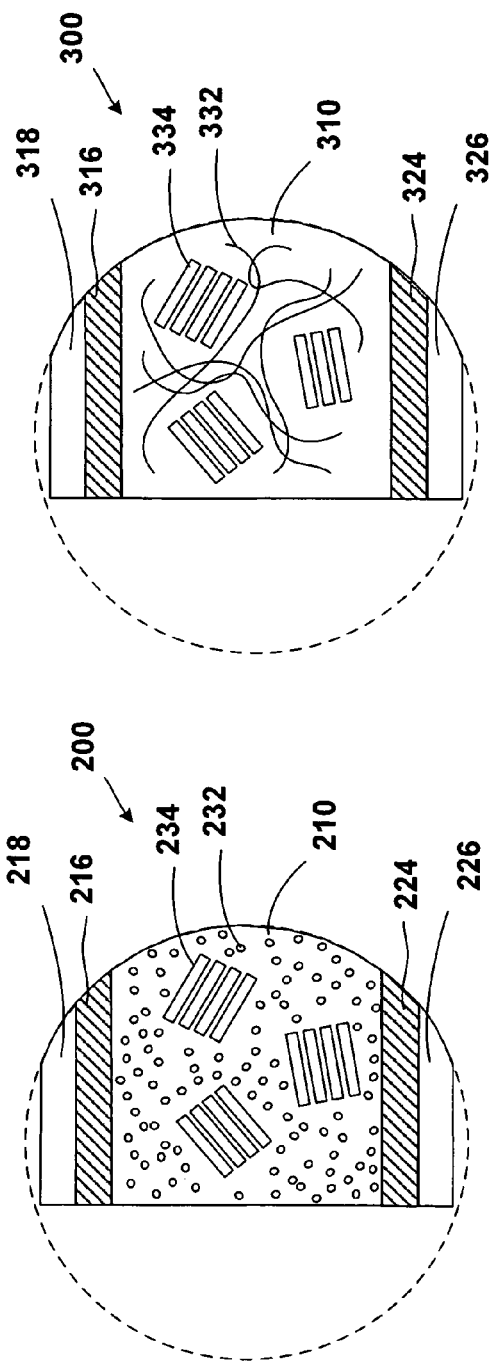
FIG. 2 is a detail section taken from FIG. 1 according to an embodiment.

FIG. 2 is a detail section 200 taken from FIG. 1 according to an embodiment. The section line 2-2 in FIG. 1 shows an approximate region from the mounting substrate 100 in FIG. 1. The detail section 200 is greatly simplified for illustrative purposes.

The mounting substrate 200 includes a core 210. In an embodiment, the core 210 includes a polymer base that includes a first clay platelet 234 having a particle size of about 99% passing 50 nanometers (nm). In an embodiment, the core 210 is a BT polymer base that includes a first clay platelet 234 having a particle size of about 99% passing 50 nm.

In an embodiment, the mounting substrate 200 is an article that includes the core 210 and a first metallic foil 216 that is disposed upon the core 210. In an embodiment, the first metallic foil 216 includes copper. A solder mask first film 218 is disposed upon the first metallic foil 216 according to an embodiment.

In an embodiment, the mounting substrate 200 is an article that also includes a second metallic foil 224 that is disposed upon the core 210. In an embodiment, the second metallic foil 224 includes copper and is typical of the copper that can be used in boards to make traces and other electrical structures. A solder mask second film 226 is disposed upon the second metallic foil 224 according to an embodiment.

In an embodiment, a monomer or oligomer is provided, depicted as clusters of dots, one of which is demarcated with the reference numeral 232. Along with the monomer or oligomer, a first clay platelet 234 is depicted in substantially co-planar clusters. By "substantially co-planar clusters" it is understood that a significant portion of the first clay platelet 234 that is present in the mounting substrate 200 is immediately adjacent to another first clay platelet or a plurality of first clay platelets. In FIG. 2, the substantially co-planar clusters are depicted as four clay platelets 234 disposed in the larger matrix of the monomer or oligomer.

In an embodiment, the substantially co-planar clusters of the first clay platelet 234 are in a size range of about 99% passing 50 nm. In an embodiment, the substantially co-planar clusters of the first clay platelet 234 are present in the core 210 in a weight range from about 1% to about 15%. In an embodiment, the substantially co-planar clusters of the first clay platelet 234 are in a size range of about 99% passing 50 nm and in a weight range from about 1% to about 15%.

In a process embodiment, the monomer or oligomer is first melt blended with the first clay platelet 234, followed by curing of the compound to form the core 210 as schematically illustrated. In this embodiment, a complete cure of the monomer or oligomer is not accomplished. In this embodiment, the monomer or oligomer is cross-linked and/or cured to a completion range from about 30% polymerized to about 99% polymerized. In an embodiment, the monomer or oligomer is cross-linked and/or cured to a completion range from about 50% polymerized to about 90% polymerized. In an embodiment, the monomer or oligomer is cross-linked and/or cured to a completion range from about 70% polymerized to about 80% polymerized.

In a method embodiment, the core 210 is cured to a given degree of polymerization, and is also formed as a polymer film upon a metallic foil such as a first metallic foil 216. The method of forming the polymer film (to become the core 210) upon the first metallic foil 216 includes laying the first metallic foil 216 upon a B-staged polymer-clay platelet compound according to an embodiment. In an embodiment, the method of forming the polymer film upon the first metallic foil 216 includes flowing a partially-cured polymer-clay platelet compound upon the first metallic foil 216, followed by further curing of the compound. Other methods can be used as are known in the art for laminating a board with a metallic foil and a solder mask, when combined with the disclosures set forth herein.

In a process embodiment, the monomer or oligomer is first mixed with a solvent and blended with the first clay platelet 234, followed by allowing the solvent to escape from the solution. After solvent is significantly removed, curing of the monomer or oligomer is carried out. In this embodiment, a complete cure of the monomer or oligomer is not accomplished. In this embodiment, the monomer or oligomer is cross-linked and/or cured to a completion range from about 30% polymerized to about 99% polymerized. In an embodiment, the monomer or oligomer is cross-linked and/or cured to a completion range from about 50% polymerized to about 90% polymerized. In an embodiment, the monomer or oligomer is cross-linked and/or cured to a completion range from about 70% polymerized to about 80% polymerized.

Figure 3:
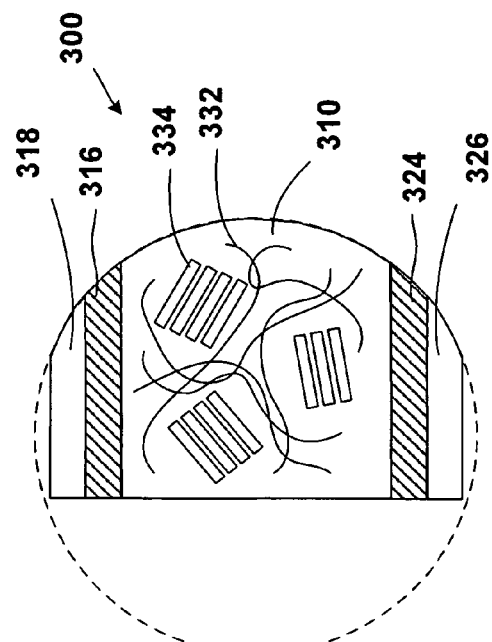
FIG. 3 is a detail section taken from FIG. 1 according to an embodiment.

FIG. 3 is a detail section 300 taken from FIG. 1 according to an embodiment. The section line 2-2 in FIG. 1 shows an approximate region from the mounting substrate 100 in FIG. 1. The detail section 300 is greatly simplified for illustrative purposes.

The mounting substrate 300 includes a core 310. In an embodiment, the core 310 includes a polymer base that includes a first clay platelet 334 having a particle size of about 99% passing 50 nanometers (nm). In an embodiment, the core 310 is a BT polymer base that includes a first clay platelet 334 having a particle size of about 99% passing 50 nm.

In an embodiment, the mounting substrate 300 is an article that includes the core 310 and a first metallic foil 316 that is disposed upon the core 310. In an embodiment, the first metallic foil 316 includes copper. A solder mask first film 318 is disposed upon the first metallic foil 316 according to an embodiment.

In an embodiment, the mounting substrate 300 is an article that also includes a second metallic foil 324 that is disposed upon the core 310. In an embodiment, the second metallic foil 324 includes copper and is typical of the copper that can be used in boards to make traces and other electrical structures. A solder mask second film 326 is disposed upon the second metallic foil 324 according to an embodiment.

In an embodiment, a monomer or oligomer is provided, depicted as linked, cured, or cross-linked polymers, one of which is demarcated with the reference numeral 332. Along with the linked, cured, or cross-linked polymers 332, a first clay platelet 334 is depicted in substantially co-planar clusters. In FIG. 3, the substantially co-planar clusters are depicted as four clay platelets 334 disposed in the larger matrix of the linked, cured, or cross-linked polymers 332.

In an embodiment, the substantially co-planar clusters of the first clay platelet 334 are in a size range of about 99% passing 50 nm. In an embodiment, the substantially co-planar clusters of the first clay platelet 334 is present in the core 310 in a weight range from about 1% to about 15%. In an embodiment, the substantially co-planar clusters of the first clay platelet 334 are in a size range of about 99% passing 50 nm and in a weight range from about 1% to about 15%.

Figure 4:
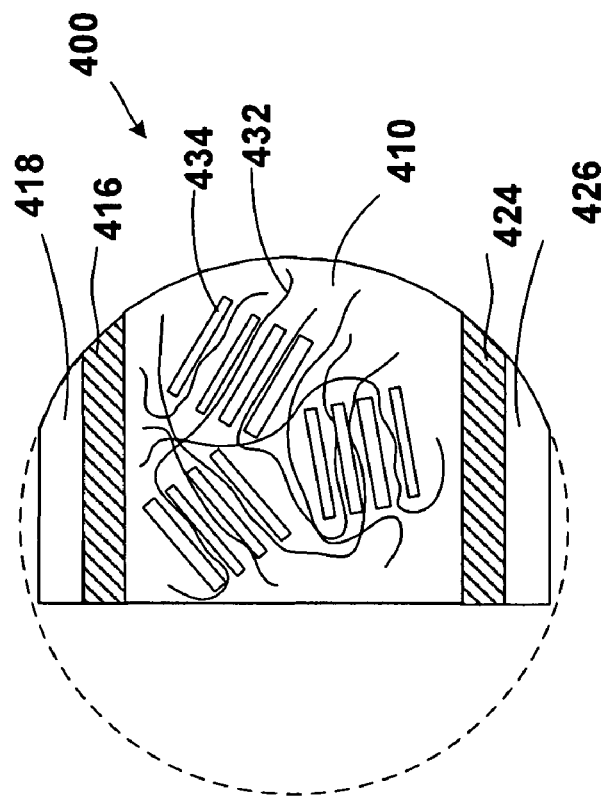
FIG. 4 is a detail section taken from FIG. 1 according to an embodiment.

FIG. 4 is a detail section 400 taken from FIG. 1 according to an embodiment. The section line 2-2 in FIG. 1 shows an approximate region from the mounting substrate 100 in FIG. 1. The detail section 400 is greatly simplified for illustrative purposes.

The mounting substrate 400 includes a core 410. In an embodiment, the core 410 includes a polymer base that includes a first clay platelet 434 having a particle size of about 99% passing 50 nanometers (nm). In an embodiment, the core 410 is a BT polymer base that includes a first clay platelet 434 having a particle size of about 99% passing 50 nm.

In an embodiment, the mounting substrate 400 is an article that includes the core 410 and a first metallic foil 416 that is disposed upon the core 410. In an embodiment, the first metallic foil 416 includes copper. A solder mask first film 418 is disposed upon the first metallic foil 416 according to an embodiment.

In an embodiment, the mounting substrate 400 is an article that also includes a second metallic foil 424 that is disposed upon the core 410. In an embodiment, the second metallic foil 424 includes copper and is typical of the copper that can be used in boards to make traces and other electrical structures. A solder mask second film 426 is disposed upon the second metallic foil 424 according to an embodiment.

In an embodiment, a monomer or oligomer is provided, depicted as linked, cured, or cross-linked polymers, one of which is demarcated with the reference numeral 432. Along with the linked, cured, or cross-linked polymers 432, a first clay platelet 434 is depicted in substantially intercalated clusters. By "substantially intercalated clusters" it is understood that a significant portion of the first clay platelet 434 that is present in the mounting substrate 400 is immediately adjacent to another first clay platelet or a plurality of first clay platelets, but the clusters have been intercalated with the linked, cured, or cross-linked polymers 432. In FIG. 4, the substantially intercalated clusters are depicted as four clay platelets 434 disposed in the larger matrix of the linked, cured, or cross-linked polymers.

In an embodiment, the polymer base is BT. In an embodiment, the nanoclay platelets 434 are assisted in fire-retardant qualities with an hydroxide moiety such as aluminum hydroxide, $Al(OH)_3$. In an embodiment, where the amount of the nanoclay could be present alone in the range from about 1% to about 15%, when the $Al(OH)_3$ moiety is present in an amount of about 5%, the maximum nanoclay platelets 434 are present in an amount of about 12%.

In an embodiment, the substantially intercalated clusters of the first clay platelet 434 are in a size range (individual platelets 434) of about 99% passing 50 nm. In an embodiment, the substantially intercalated clusters of the first clay platelet 434 are present in the core 410 in a weight range from about 1% to about 15%. In an embodiment, the substantially intercalated clusters of the first clay platelet 434 are in a size range of about 99% passing 50 nm and in a weight range from about 1% to about 15%.

Figure 5:
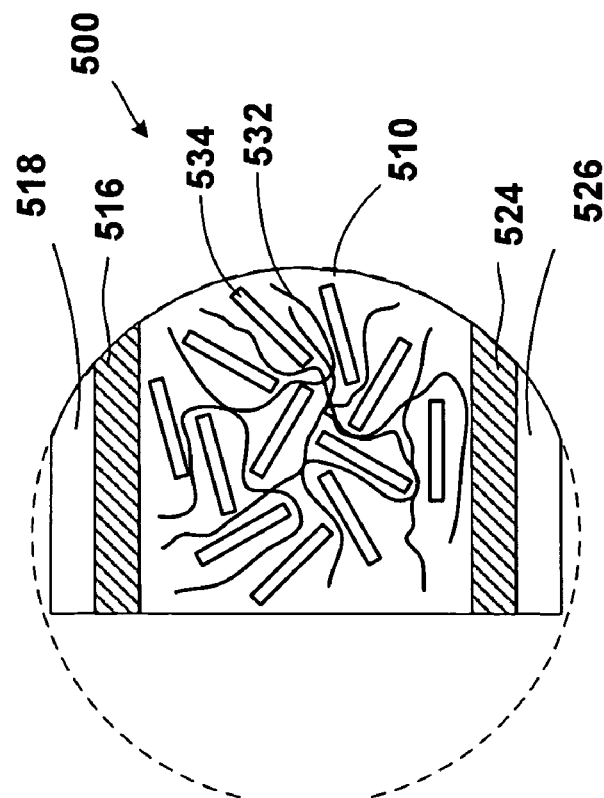
FIG. 5 is a detail section taken from FIG. 1 according to an embodiment.

FIG. 5 is a detail section 500 taken from FIG. 1 according to an embodiment. The section line 2-2 in FIG. 1 shows an approximate region from the mounting substrate 100 in FIG. 1. The detail section 500 is greatly simplified for illustrative purposes.

The mounting substrate includes a core 510. In an embodiment, the core 510 includes a polymer base that includes a first clay platelet 534 having a particle size of about 99% passing 50 nanometers (nm). In an embodiment, the core 510 is a BT polymer base that includes a first clay platelet 534 having a particle size of about 99% passing 50 nm.

In an embodiment, the mounting substrate is part of an article that includes the core 510 and a first metallic foil 516 that is disposed upon the core 510. In an embodiment, the first metallic foil 516 includes copper. A solder mask first film 518 is disposed upon the first metallic foil 516 according to an embodiment.

In an embodiment, the mounting substrate is part of an article that also includes a second metallic foil 524 that is disposed upon the core 510. In an embodiment, the second metallic foil 524 includes copper and is typical of the copper that can be used in boards to make traces and other electrical structures. A solder mask second film 526 is disposed upon the second metallic foil 524 according to an embodiment.

In an embodiment, a monomer or oligomer is provided, depicted as linked, cured, or cross-linked polymers, one of which is demarcated with the reference numeral 532. Along with the linked, cured, or cross-linked polymers 532, a first clay platelet 534 is depicted in a substantially exfoliated configuration. By a "substantially exfoliated configuration" it is understood that the first clay platelet 534 that is present in the mounting substrate 500 is separated from most or all adjacent first clay platelets or a plurality of all adjacent first clay platelets, and the platelets have been separated by the linked, cured, or cross-linked polymers 532. In FIG. 5, the substantially exfoliated configuration of platelets are depicted as separated clay platelets 534 disposed in the larger matrix of the linked, cured, or cross-linked polymers.

In an embodiment, the substantially exfoliated configuration of platelets of the first clay platelet 534 is in a size range of about 99% passing 50 nm. In an embodiment, the substantially exfoliated configuration of platelets of the first clay platelet 534 is present in the core 510 in a weight range from about 1% to about 15%. In an embodiment, the substantially exfoliated configuration of platelets of the first clay platelet 534 is in a size range of about 99% passing 50 nm and in a weight range from about 1% to about 15%.

Aspect ratios of the nanoclay platelets are selected according to specific applications. In an embodiment, exfoliating the nanoclay into the matrix can be done by using dispersed nano platelets with high aspect ratio in a range from about 1:1 to about 200:1. The resulting nanoclay composite material has improved high acceleration stress test ("HAST") performance, and slows the release of volatile components for reduced pump-out, bleed-out, and dry-out of the core material. The nanoclay particles also improve the thermo-oxidative stability of the core for improved bake and thermal cycling ("TC") performance.

The addition of the nanoclay platelet particles to the core materials results in semiconductor or microelectronic packages that have improved reliability and performance. The improved reliability and performance results from reduced pump-out, reduced dry out, and improved thermo-oxidative stability of the thermal interfaced material. Pump-out, dry out, and thermo-oxidative stability are governed by diffusion processes. The polymer-nanoclay composite embodiments may be mixed by a wide variety of process.

This disclosure may be practiced with a wide variety of matrix organics. In an embodiment, the matrix organic is BT. In addition to the BT polymer, other organics can be added. In an embodiment, BT is present in a major amount and is complement with a second polymer or the like that is present in a minor amount. In an embodiment, an olefinic resin is present as a polymer second organic, which is second to the BT polymer first organic. In an embodiment the olefinic resin is at least one of polyethylene, polypropylene, polystyrene, paraffin wax, unsaturated olefin rubbers like polybutadiene or polyisoprene, saturated rubbers like ethylene-propylene, ethylene-propylene-diene monomer (EPDM), hydrogenated polyisoprene, and the like. In an embodiment, a can polyimide core material also be added as a stand-alone core matrix, or as a component of a core matrix.

In an embodiment, the polymer-nanoclay compound includes a thermal conductivity of greater than about 50 W/mK. Examples of useful fillers include ceramics, such as aluminum oxide, boron nitride, aluminum nitride, and the like; metals, such as aluminum, copper, silver, and the like; and solders, such as indium, tin, tin-indium, silver, tin-silver, tin-indium-silver, and the like. Typically, the amount of thermally conductive filler is in a range from about 10% to about 90%, depending on several factors required in specific applications, including the desired bulk thermal conductivity and the selection of the specific nanoclay platelets.

In an embodiment, more than one quality of nanoclay platelets is used. Useful nanoclay materials include natural, synthetic, and modified phyllosilicates. Natural clays include smectite clays, such as montmorillonite, saponite, hectorite, mica, vermiculite, bentonite, nontronite, beidellite, volkonskoite, magadite, kenyaite, and the like. Synthetic clays include synthetic mica, synthetic saponite, synthetic hectorite, and the like.

In an embodiment, the nanoclays are present as at least two different nanoclays. For example, the nanoclays include hectorite in a first amount and a montmorollonite in a second amount that is lesser than the first amount.

In an embodiment, the nanoclays are substantially halogen free. By "substantially halogen free" it is meant that halogens are not used in raw materials and/or supplies for the preparation of the nanoclays and the polymer bases, such that halogens are not detected under ordinary analytical techniques, except for detectable impurities.

In an embodiment, an intercalated layered clay material is prepared by the reaction of a swellable layered clay with one or more organic cations, preferably ammonium compounds, to effect partial or complete cation exchange. Numerous methods to modify layered clays with organic cations can be used, and any of these may be used in the practice embodiments. One embodiment is the organic modification of a layered nanoclay with an organic cation salt (non-halide) by the process of dispersing a layered clay or mixture of clays into hot water (50 to 80° C.), adding the organic cation salt (heated or dissolved in water or alcohol) with agitation, then blending for a period of time sufficient for the organic cations to exchange most of the metal cations present in the galleries between the layers of the clay material(s). Then, the organically modified layered clay material(s) is isolated by methods known in the art, including filtration, centrifugation, spray drying, and their combinations.

In an embodiment, the nanoclay is further treated for the purposes of aiding exfoliation in the composite and/or improving the strength of the polymer/clay interface. Any treatment that achieves the above goals may be used. Examples of useful treatments include intercalation with water-soluble or water-insoluble polymers, organic reagents or monomers, silane compounds, metals or organometallics, and/or their combinations.

In an embodiment, the nanoclays are dispersed in the polymer matrix such that most of the nanoclay material exists as individual platelet particles (exfoliated), small tactoids (intercalated), and small aggregates of tactoids (platelet clusters) with dimensions of less than about 20 nm. Compositions with the higher concentration of individual platelet particles and fewer tactoids or aggregates can also be used.

Figure 6:
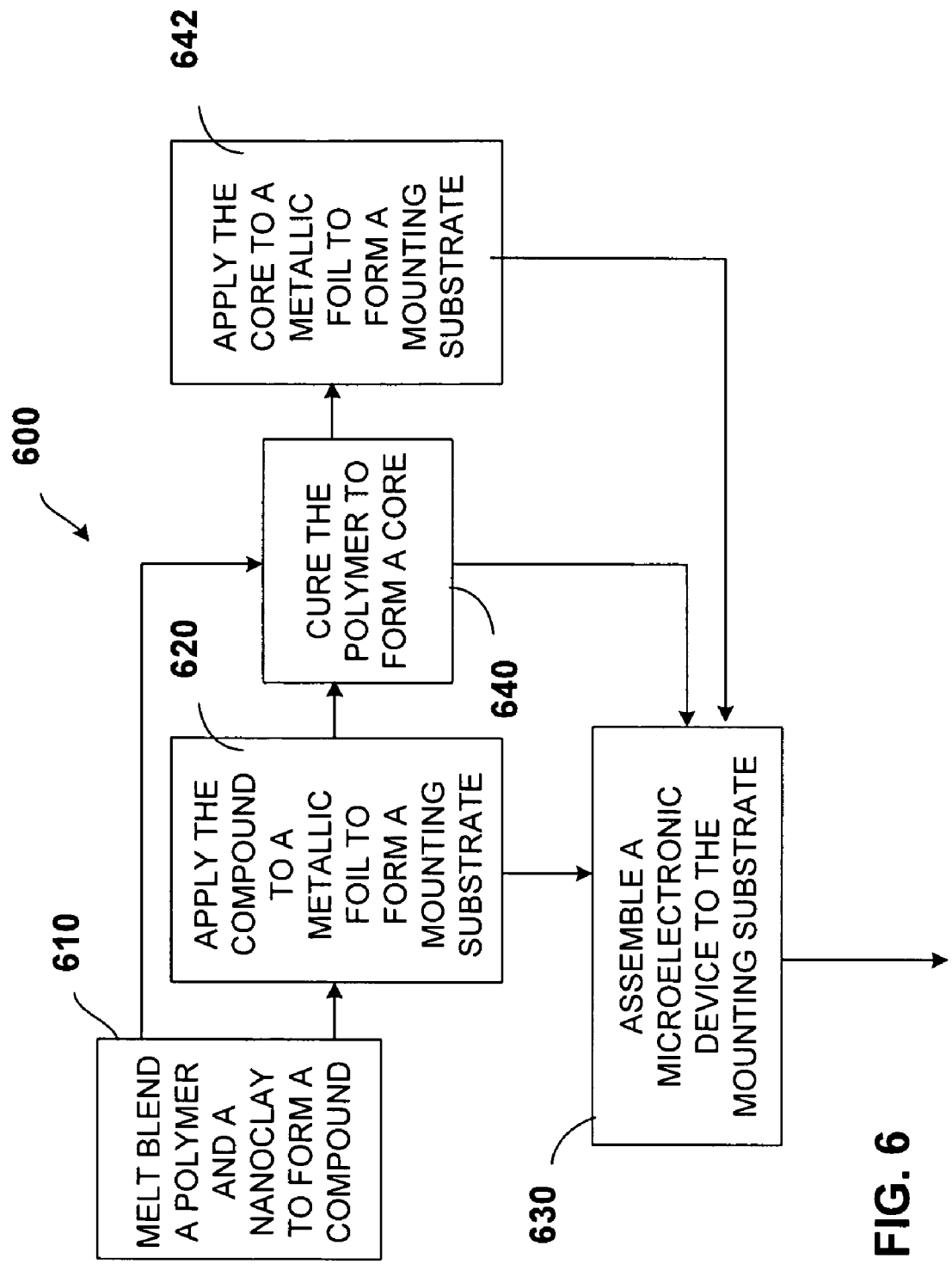
FIG. 6 is a process flow chart that describes process and method flow embodiments.

FIG. 6 is a process flow chart 600 that describes process and method flow embodiments. At 610 the process includes melt blending a polymer and a nanoclay to form a compound. In this embodiment, the compound includes the nanoclay, whether co-planar clustered, intercalated, or exfoliated, in the polymer matrix. The degree of separation of the nanoclay platelets can be extended during melt blending by the mechanical shear of a melt-blending apparatus. Accordingly, the melt blending can be extended to achieve, e.g. substantially exfoliated nanoclay platelets in a polymer matrix.

At 620, the process includes applying the compound to a metallic foil to form a mounting substrate. Several embodiments of mounting substrates are depicted in this disclosure including the text supporting FIGS. 2-5. In an embodiment, the process commences at 610 and terminates at 620.

Figure 8:
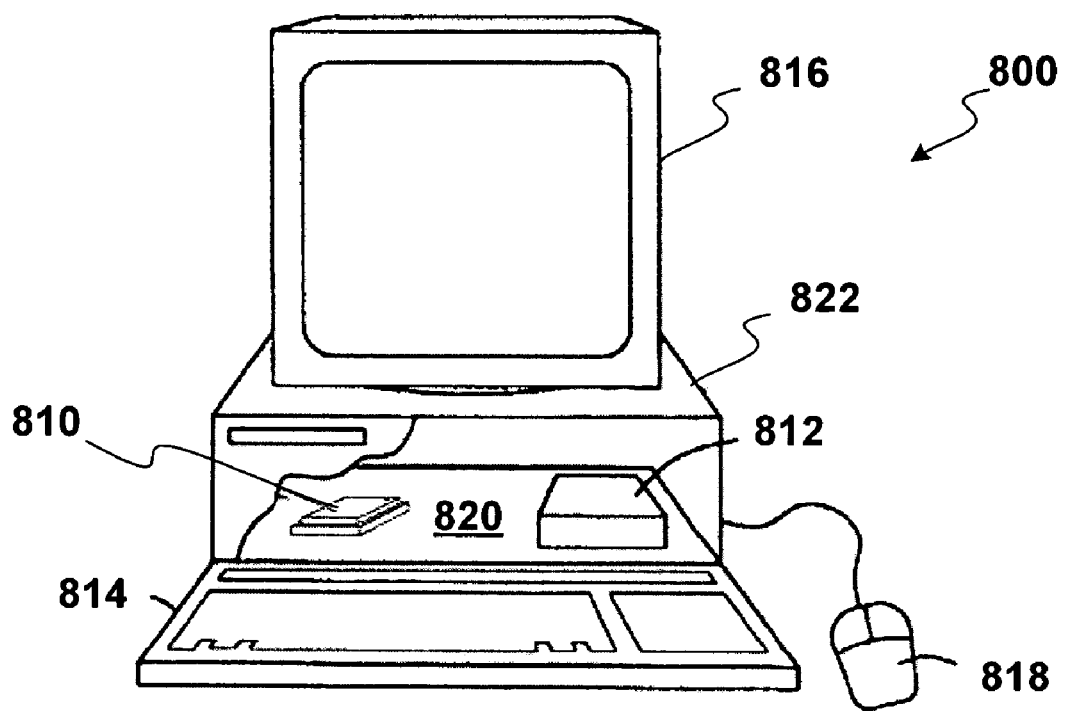
FIG. 8 is a cut-away elevation that depicts a computing system according to an embodiment.

At 630, the process includes assembling a microelectronic device to the mounting substrate. An illustration of a microelectronic device assembled to a mounting substrate is depicted in FIG. 8. In an embodiment, the process commences at 610 and terminates at 630.

At 640 the process flows from 610 to curing the polymer to form a core. Several embodiments of mounting substrates are depicted in this disclosure including the text supporting FIGS. 1-5. In an embodiment, the process commences at 610 and terminates at 640. In an embodiment, the process commences at 610, flows to 620, and terminates at 640.

At 642, the process includes applying the core to a metallic foil to form a mounting substrate. In an embodiment, the process commences at 610 and terminates at 640. In an embodiment, the process commences at 610, flows to 640, and 642, and terminates at 630.

Figure 7:
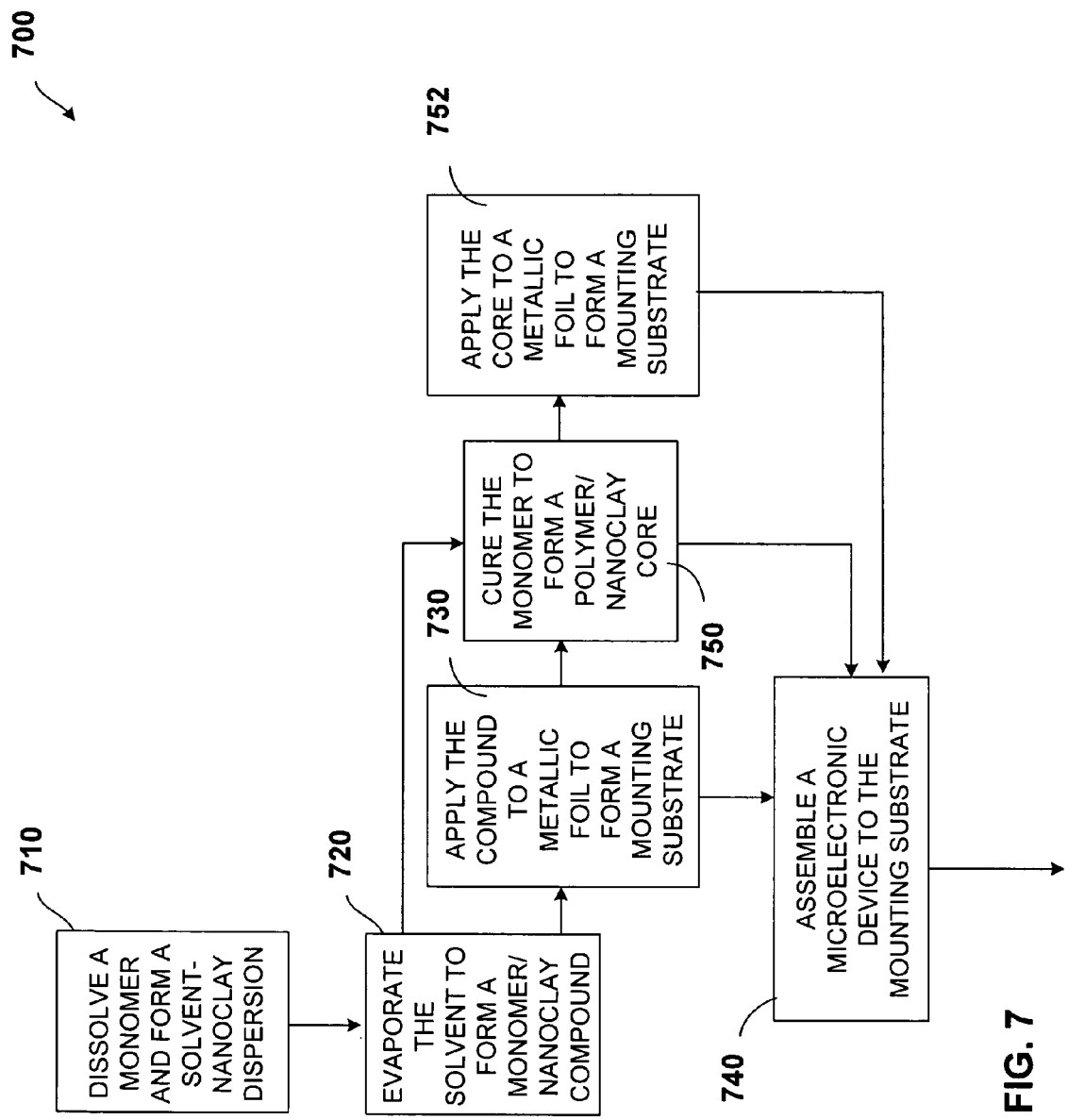
FIG. 7 is a process flow chart that describes process and method flow embodiments.

FIG. 7 is a process flow chart 700 that describes process and method flow embodiments. At 710 the process includes dissolving a monomer or oligomer, or both, to form a solvent-nanoclay dispersion. The process of dissolving the organics etc., to form a solution can include achieving a degree of separation of the nanoclay platelets by the mechanical shear of a mixing apparatus.

At 720, the process includes evaporating the solvent to form a monomer (or oligomer, etc.) nanoclay compound. In an embodiment, the process commences at 710 and terminates at 720.

At 730, the process includes applying the compound to a metallic foil to form a mounting substrate. Several embodiments of mounting substrates are depicted in this disclosure including the text supporting FIGS. 2-5. In an embodiment, the process commences at 710 and terminates at 730.

At 740, the process includes assembling a microelectronic device to the mounting substrate. An illustration of a microelectronic device assembled to a mounting substrate is depicted in FIG. 8. In an embodiment, the process commences at 710 and terminates at 740.

At 750 the process flows from 720 to curing the monomer or oligomer to form a core. Several embodiments of mounting substrates are depicted in this disclosure including the text supporting FIGS. 1-5. In an embodiment, the process commences at 710 and terminates at 750. In an embodiment, the process commences at 710, flows to 730, and terminates at 750.

At 752, the process includes applying the core to a metallic foil to form a mounting substrate. In an embodiment, the process commences at 710 and terminates at 752. In an embodiment, the process commences at 710, flows to 750, and 752, and terminates at 740.

FIG. 8 is a cut-away elevation that depicts a computing system 800 according to an embodiment. One or more of the foregoing embodiments of the nanoclay-in-a-polymer matrix core may be utilized in a computing system, such as a computing system 800 of FIG. 8. Hereinafter any nanoclay-in-a-polymer matrix core embodiment alone, or in combination with any other embodiment, is referred to as an embodiment(s) configuration.

The computing system 800 includes at least one processor (not pictured), which is enclosed in an IC chip package 810, a data storage system 812, at least one input device such as a keyboard 814, and at least one output device such as a monitor 816, for example. In an embodiment, the data storage system 812 is random-access memory such as dynamic random-access memory (DRAM), polymer memory, flash memory, of phase-change memory. The computing system 800 includes a processor that processes data signals, and may include, for example, a microprocessor, available from Intel Corporation. In addition to the keyboard 814, the computing system 800 can include another user input device such as a mouse 818, for example. The computing system 800 can include a structure, after processing as depicted in FIGS. 1, 3, 4, and 5 of a given nanoclay-in-a-polymer matrix core embodiment. In an embodiment, the computing system 800 includes a housing 822 such as the box for a desktop computer.

For purposes of this disclosure, a computing system 800 embodying components in accordance with the claimed subject matter may include any system that utilizes a microelectronic device system, which may include, for example, at least one of the nanoclay-in-a-polymer matrix core embodiments that is coupled to data storage such as the DRAM, polymer memory, flash memory, or the phase-change memory. In this embodiment, the embodiment(s) is coupled to any combination of these functionalities by being coupled to a processor. In an embodiment, however, an embodiment(s) configuration set forth in this disclosure is coupled to any of these functionalities. For an example embodiment, data storage includes an embedded DRAM cache on a die. Additionally in an embodiment, the embodiment(s) configuration that is coupled to the processor (not pictured) is part of the system with an embodiment(s) configuration that is coupled to the data storage of the DRAM cache. Additionally in an embodiment, an embodiment(s) configuration is coupled to the data storage 812.

In an embodiment, the computing system 800 can also include a die that contains a digital signal processor (DSP), a micro controller, an application specific integrated circuit (ASIC), or a microprocessor. In this embodiment, the embodiment(s) configuration is coupled to any combination of these functionalities by being coupled to a processor. For an example embodiment, a DSP is part of a chipset that may include a stand-alone processor and the DSP as separate parts of the chipset on the board 820, which is a nanoclay-in-a-polymer matrix core embodiment. In this embodiment, an embodiment(s) configuration is coupled to the DSP, and a separate embodiment(s) configuration may be present that is coupled to the processor in the IC chip package 810. Additionally in an embodiment, an embodiment(s) configuration is coupled to a DSP that is mounted on the same board 820 as the IC chip package 810. It can now be appreciated that the embodiment(s) configuration can be combined as set forth with respect to the computing system 800, in combination with an embodiment(s) configuration as set forth by the various embodiments of the nanoclay-in-a-polymer matrix core within this disclosure and their equivalents.

It can now be appreciated that embodiments set forth in this disclosure can be applied to devices and apparatuses other than a traditional computer. For example, a die can be packaged with an embodiment(s) configuration, and placed in a portable device such as a wireless communicator or a hand-held device such as a personal data assistant and the like. In this embodiment, the system housing can be a shell for a wireless telephone or the like. Another example is a die that can be packaged with an embodiment(s) configuration and placed in a vehicle such as an automobile, a locomotive, a watercraft, an aircraft, or a spacecraft.

Figure 9:
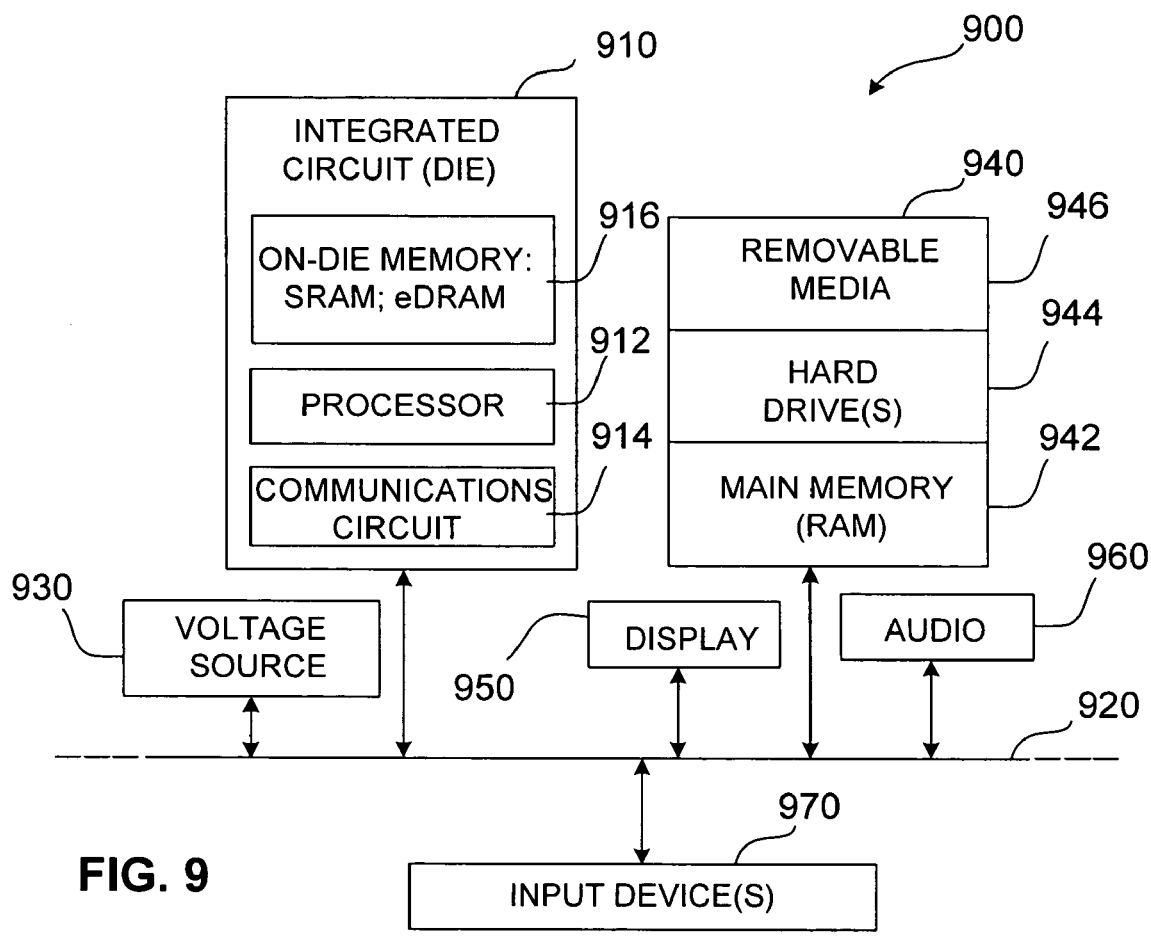
FIG. 9 is a schematic of an electronic system according to an embodiment.

FIG. 9 is a schematic of an electronic system 900 according to an embodiment. The electronic system 900 as depicted can embody the computing system 800 depicted in FIG. 8, but the electronic system is depicted more generically. The electronic system 900 incorporates at least one mounting substrate, for example the board 820 depicted in FIG. 8, with an electronic assembly, such as an integrated circuit (IC) die 910. In an embodiment, the electronic system 900 is a computer system that includes a system bus 920 to electrically couple the various components of the electronic system 900. The system bus 920 is a single bus or any combination of busses according to various embodiments. The electronic system 900 includes a voltage source 930 that provides power to the integrated circuit 910. In some embodiments, the voltage source 930 supplies current to the integrated circuit 910 through the system bus 920.

The integrated circuit 910 is electrically coupled to the system bus 920 and includes any circuit, or combination of circuits according to an embodiment. In an embodiment, the integrated circuit 910 includes a processor 912 that can be of any type. As used herein, the processor 912 means any type of circuit such as, but not limited to, a microprocessor, a microcontroller, a graphics processor, a digital signal processor, or another processor. Other types of circuits that can be included in the integrated circuit 910 are a custom circuit or an ASIC, such as a communications circuit 914 for use in wireless devices such as cellular telephones, pagers, portable computers, two-way radios, and similar electronic systems. In an embodiment, the processor 910 includes on-die memory 916 such as SRAM. In an embodiment, the processor 910 includes on-die memory 916 such as eDRAM.

In an embodiment, the electronic system 900 also includes an external memory 94 that in turn may include one or more memory elements suitable to the particular application, such as a main memory 942 in the form of RAM, one or more hard drives 944, and/or one or more drives that handle removable media 946, such as diskettes, compact disks (CDs), digital video disks (DVDs), flash memory keys, and other removable media known in the art.

In an embodiment, the electronic system 900 also includes a display device 950, and an audio output 960. In an embodiment, the electronic system 900 includes an input device 970, such as a keyboard, mouse, trackball, game controller, microphone, voice-recognition device, or any other device that inputs information into the electronic system 900.

As shown herein, the integrated circuit 910 can be implemented in a number of different embodiments, including an electronic package, an electronic system, a computer system, one or more methods of fabricating an integrated circuit, and one or more methods of fabricating an electronic assembly that includes the integrated circuit mounted on a board, and the nanoclay-in-a-polymer matrix core embodiments as set forth herein in the various embodiments and their art-recognized equivalents. The elements, materials, geometries, dimensions, and sequence of operations can all be varied to suit particular packaging requirements.

The Abstract is provided to comply with 37 C.F.R. §1.72(b) requiring an abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the disclosure require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

It will be readily understood to those skilled in the art that various other changes in the details, material, and arrangements of the parts and method stages which have been described and illustrated in order to explain the nature embodiments may be made without departing from the principles and scope of the disclosure as expressed in the subjoined claims.

What is claimed is:

1. An article comprising:
   a polymer base including a polymer base first side and a polymer base second side,
   a first clay platelet dispersed in the polymer base, wherein the first clay platelet has a particle size of about 99% passing minus-50 nanometers, and wherein the first clay platelet has a concentration range from about 1% to about 15%; and
   a first metallic foil including a first metallic foil first side and a first metallic foil second side, wherein the first metallic foil is disposed on the polymer base first side.

2. The article of claim 1, wherein the polymer base principally contains bismaleimide triazine (BT).

3. The article of claim 1, further including a solder mask first film disposed above and on the first metallic foil, wherein the solder mask first film includes at least one recess therein that exposes the first metallic foil.

4. The article of claim 1, wherein the first metallic foil is principally copper.

5. The article of claim 1, wherein the polymer base is substantially halogen free.

6. The article of claim 1, further including a solder mask first film disposed above and on the first metallic foil.

7. The article of claim 1, further including a second metallic foil including a second metallic foil first side and a second metallic foil second side, wherein the second metallic foil is disposed on the polymer base second side.

8. The article of claim 1, further including:
   a second metallic foil including a second metallic foil first side and a second metallic foil second side, wherein the second metallic foil is disposed on the polymer base second side; and
   a solder mask second film disposed below and on the second metallic foil.

9. The article of claim 1, wherein the first clay platelet is selected from a bainite, beidellite, bentonite, hectorite, kenyaite, mica, magadite, montmorillonite, montmorollonite, nontronite, saponite, smectite, vermiculite, volkonskoite, and a combination of at least two thereof.

10. The article of claim 1, wherein the first clay platelet includes a hectorite in a first amount and a montmorollonite in a second amount that is lesser than the first amount.

11. The article of claim 1, further including an inorganic particulate selected from silica, alumina, silicon nitride, graphite, diamond, and combinations thereof.

12. The article of claim 1, wherein the polymer includes a bismaleimide triazine (BT) base, further including an inorganic particulate filler dispersed in the BT base, wherein the filler is in a range from about 10% to about 90%.

13. The article of claim 1, wherein the polymer includes a bismaleimide triazine (BT) base, and wherein the BT base is complemented with at least one second polymer.

14. The article of claim 1, wherein the polymer includes a bismaleimide triazine (BT) base wherein the first clay platelet is dispersed in the BT base, and wherein the first clay platelet is substantially co-planar clustered.

15. The article of claim 1, wherein the polymer includes a bismaleimide triazine (BT) base wherein the first clay platelet is dispersed in the BT base, and wherein the first clay platelet is substantially intercalated.

16. The article of claim 1, wherein the polymer includes a bismaleimide triazine (BT) base wherein the first clay platelet is dispersed in the BT base, and wherein the first clay platelet is substantially exfoliated.

17. The article of claim 1, wherein the first clay platelet has a particle size of about 99% passing minus-20 nanometers, and wherein the first clay platelet has a concentration range from about 2% to about 10%.

18. The article of claim 1, wherein the polymer includes a bismaleimide triazine (BT) base, wherein the composition is substantially halogen free, wherein the first platelet is selected from a bainite, beidellite, bentonite, hectorite, kenyaite, mica, magadite, montmorillonite, montmorollonite, nontronite, saponite, smectite, vermiculite, volkonskoite, and a combination of at least two thereof, and wherein the BT base is complemented with at least one of a second polymer.

* * * * *

UNITED STATES PATENT AND TRADEMARK OFFICE
CERTIFICATE OF CORRECTION

| | | |
|---|---|---|
| PATENT NO. | : 8,163,830 B2 | Page 1 of 1 |
| APPLICATION NO. | : 11/395728 | |
| DATED | : April 24, 2012 | |
| INVENTOR(S) | : Praveen Bhimaraj et al. | |

It is certified that error appears in the above-identified patent and that said Letters Patent is hereby corrected as shown below:

In column 12, line 26, in claim 9, delete "magadite," and insert -- magadiite, --, therefor.

In column 12, line 62, in claim 18, delete "magadite," and insert -- magadiite, --, therefor.

Signed and Sealed this
Seventh Day of August, 2012

David J. Kappos
*Director of the United States Patent and Trademark Office*